(12) United States Patent
Chantre et al.

(10) Patent No.: US 9,640,631 B2
(45) Date of Patent: May 2, 2017

(54) BIPOLAR TRANSISTOR MANUFACTURING METHOD

(71) Applicant: STMicroelectronics SA, Montrouge (FR)

(72) Inventors: Alain Chantre, Seyssins (FR); Pascal Chevalier, Chapareillan (FR); Gregory Avenier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 1 day.

(21) Appl. No.: 14/970,341

(22) Filed: Dec. 15, 2015

(65) Prior Publication Data
US 2016/0099334 A1     Apr. 7, 2016

Related U.S. Application Data

(62) Division of application No. 13/859,341, filed on Apr. 9, 2013, now abandoned.

(51) Int. Cl.
*H01L 29/66* (2006.01)
*H01L 21/8249* (2006.01)
(Continued)

(52) U.S. Cl.
CPC .... *H01L 29/66272* (2013.01); *H01L 21/8249* (2013.01); *H01L 27/1203* (2013.01);
(Continued)

(58) Field of Classification Search
CPC ........... H01L 29/66242; H01L 29/1004; H01L 29/66287; H01L 29/7371; H01L 27/0623; H01L 2924/0002; H01L 29/732; H01L 21/8249; H01L 27/1203; H01L 2924/00; H01L 29/0649; H01L 29/0804; H01L 29/0821; H01L 29/205

See application file for complete search history.

(56) References Cited

U.S. PATENT DOCUMENTS

2002/0024061 A1* 2/2002 Kondo ................ H01L 31/1105
257/198
2002/0053705 A1* 5/2002 Kondo ................ H01L 21/8249
257/368
(Continued)

FOREIGN PATENT DOCUMENTS

WO     03/049192 A1    6/2003

*Primary Examiner* — Su C Kim
*Assistant Examiner* — David S Wilbert
(74) *Attorney, Agent, or Firm* — Seed IP Law Group LLP

(57) ABSTRACT

A method for manufacturing a bipolar transistor, including the steps of: forming a first surface-doped region of a semiconductor substrate having a semiconductor layer extending thereon with an interposed first insulating layer; forming, at the surface of the device, a stack of a silicon layer and of a second insulating layer; defining a trench crossing the stack and the semiconductor layer opposite to the first doped region, and then an opening in the exposed region of the first insulating layer; forming a single-crystal silicon region in the opening; forming a silicon-germanium region at the surface of single-crystal silicon region, in contact with the remaining regions of the semiconductor layer and of the silicon layer; and forming a second doped region at least in the remaining space of the trench.

22 Claims, 7 Drawing Sheets

(51) Int. Cl.
*H01L 27/12* (2006.01)
*H01L 29/73* (2006.01)
*H01L 29/732* (2006.01)
*H01L 29/737* (2006.01)
*H01L 29/10* (2006.01)

(52) U.S. Cl.
CPC .... *H01L 29/1004* (2013.01); *H01L 29/66234* (2013.01); *H01L 29/66242* (2013.01); *H01L 29/66265* (2013.01); *H01L 29/73* (2013.01); *H01L 29/7317* (2013.01); *H01L 29/7322* (2013.01); *H01L 29/7371* (2013.01)

(56) References Cited

U.S. PATENT DOCUMENTS

| | | | |
|---|---|---|---|
| 2004/0222486 A1* | 11/2004 | Ellis-Monaghan | H01L 29/66265 257/507 |
| 2006/0154450 A1 | 7/2006 | Suzumura et al. | |
| 2010/0258799 A1 | 10/2010 | Matsuoka | |
| 2011/0312147 A1* | 12/2011 | Harame | H01L 29/0649 438/353 |
| 2012/0001192 A1* | 1/2012 | Fox | H01L 29/0804 257/75 |
| 2013/0187198 A1 | 7/2013 | Camillo-Castillo et al. | |

\* cited by examiner

BIPOLAR TRANSISTOR MANUFACTURING METHOD

BACKGROUND

Technical Field

The present disclosure relates to bipolar transistors formed on an integrated circuit. More specifically, the present disclosure relates to a method for manufacturing such a transistor.

Description of the Related Art

In integrated circuits, it may be advantageous to integrate, on a same wafer, MOS transistors and bipolar transistors (integration better known as "BiCMOS"). Indeed, these two types of transistors have specific advantages. In particular, MOS transistors allow fast switchings for digital processings, while bipolar transistors have a particularly good performance at high frequencies, for example, higher than some hundred GHz, and may have a high output power. Thus, these last transistors may be used to form circuits for controlling optical circuits, for example, lasers.

Thus, methods for simultaneously manufacturing MOS transistors and bipolar transistors on a same substrate are needed.

FIG. 1 illustrates an example of a conventional bipolar transistor formed on a solid substrate where MOS transistors can also be formed.

At the surface of a solid substrate 10 is defined an active area delimited by deep insulating trenches 12. Trenches 12 are conventionally formed and are currently known as DTI (for Deep Trench Isolation) trenches.

A heavily-doped region 14 forming the collector of the bipolar transistor extends in depth in the active area of substrate 10 delimited by trenches 12. Region 14 extends in depth in substrate 10 across a thickness on the order of 1 μm, leaving a less heavily-doped layer 16 at the substrate surface.

Shallow trenches 18, currently known as STI (for Shallow Trench Isolation) trenches, are provided on either side of the active area and stop deep in region 14. In the middle of shallow trenches 18 are provided regions 20 of access to collector region 14. Regions 20 are in practice a heavily-doped region of substrate 10.

At the surface of substrate 10 is formed a stack of an insulating layer 22, for example, an oxide, and of a heavily-doped polysilicon layer 24 (of type P if the transistor is an NPN transistor). The stack of layers 22 and 24 extends above the apparent surface of substrate 10 (region 16) and stops above a portion of shallow trench 18. Opposite to region 16, a portion of insulating layer 22 is replaced with a stack 25 of a silicon-germanium layer and of a silicon layer. Stack 25 forms the base of the bipolar transistor.

An opening is also provided in layer 24, opposite to region 16 and on a smaller surface area than the opening in region 22. In this opening defined in layer 24, as well as at the surface of layer 25, a heavily-doped region 26 forming the emitter region of the bipolar transistor is provided. Region 26 is separated from layer 22 by spacers 28 made of insulating material.

An emitter contact 29 is provided on semiconductor material 26 via a silicide layer 30 formed at the surface of semiconductor material 26. A base contact 32 is provided on layer 24 via a silicide layer 34 formed at the surface of layer 24, and a collector contact 36 is provided on regions 20 via a silicide layer 38 formed at the surface of these regions.

To obtain the device of FIG. 1, the following steps may be carried out. At an initial step, heavily doped region 14 is formed in depth in a semiconductor substrate 10. A semiconductor material epitaxy may then be performed to obtain a less heavily doped region 16 of adapted thickness. Insulating trenches 12 for delimiting the active area, as well as trenches 18, are then defined (by means of adapted masks). The dopant implantation enabling to form regions 20 is then performed.

Then, an insulating material layer (having region 22 forming a portion thereof at the end of the manufacturing) is formed over the entire active region, after which a heavily-doped polysilicon layer (having region 24 forming a portion thereof at the end of the manufacturing) is formed at the surface of the substrate. A dopant implantation is then performed in region 16, through the insulating material present above this region, to form a collector region localized in this region. An opening is then formed in heavily-doped polysilicon layer 24 opposite to region 16, this opening corresponding to the final opening defined in layer 24. An insulating material layer is then formed at the surface of layer 24 and on the walls of the previously-defined opening.

An etching is then performed from the bottom of the opening defined in layer 24 to remove the material of insulating layer 22 under the opening, but also to laterally define a cavity in the layer of material 22, under layer 24.

A silicon-germanium growth is then carried out in the cavity thus defined. Silicon-germanium 25 grows from the lower surface of polysilicon layer 24 as well as from the upper surface of region 16, to fill the cavity formed in insulating layer 22. Then, spacers 28 are formed at the surface of silicon-germanium region 25. The opening remaining at the surface of silicon-germanium layer 25 is then filled with material 26 forming the transistor emitter.

A last step comprises performing etchings to obtain the topology of the transistor of FIG. 1 and thus to expose the upper surfaces of regions 20 and 24, after which a silicidation of the device is carried out to form silicide regions 30, 34, and 38.

A first disadvantage of a bipolar transistor such as that in FIG. 1 is its bulk. Indeed, in order to operate properly, collector region 14 typically has, in substrate 10, a depth on the order of one micrometer. Such a depth is not compatible with recent methods for manufacturing MOS transistors on substrates of silicon-on-insulator type (SOI) where the upper substrate is very thin (thickness smaller than 15 nm). Such substrates, currently used in new semiconductor technologies, are called FD-SOI (fully depleted semiconductor on insulator).

Further, with the device of FIG. 1, the access to the base is performed via a layer 24 of heavily-doped polysilicon, the contact between layer 24 and silicon-germanium region 25 being achieved on a horizontal surface. This contact is illustrated in FIG. 1 by a region in dotted lines 39.

The use of a polysilicon layer to access the base alters the transistor performance. Indeed, polysilicon has a higher resistivity than, for example, a metal or heavily-doped single-crystal silicon. Thus, there is a significant access resistance between base contact 32 and base 25, which is not desired. It should be noted that the forming of single-crystal silicon for the access to the base is not compatible with the above method, a growth or a deposition of single-crystal silicon being impossible to perform on an insulating material.

Further, with the device of FIG. 1, the junction between base region 25 and collector region 16 has a relatively extensive surface area, which implies a significant junction capacitance between these two regions. To obtain a bipolar transistor having a satisfactory performance, it is desired for the junction capacitances to be as low as possible.

Thus, the bipolar transistor of FIG. 1 has junction capacitances and access resistances which are generally not compatible with a high-performance bipolar transistor.

Thus, there is a need for a method for manufacturing a high-performance bipolar transistor on a substrate of FD-SOI type.

BRIEF SUMMARY

One or more embodiments provide a method for manufacturing an integrated bipolar transistor having a very high frequency performance.

One embodiment provides such a method compatible with substrates currently used for the forming of MOS transistors.

Another embodiment relates to a bipolar transistor obtained by this method, and at an integrated circuit comprising such a bipolar transistor as well as conventional MOS transistors.

Thus, an embodiment provides a method for manufacturing a bipolar transistor, comprising the successive steps of: forming a first surface-doped region of a semiconductor substrate having a semiconductor layer extending thereon with an interposed first insulating layer; forming, at the surface of the device, a stack of a silicon layer and of a second insulating layer; defining a trench crossing the stack and the semiconductor layer opposite to the first doped region, and then an opening in the exposed region of the first insulating layer; forming a single-crystal silicon region in the opening; forming a silicon-germanium region at the surface of single-crystal silicon region, in contact with the remaining regions of the semiconductor layer and of the silicon layer; and forming a second doped region at least in the remaining space of the trench.

According to an embodiment, the semiconductor layer has a thickness ranging between 5 and 15 nm and the first insulating layer has a thickness ranging between 10 and 50 nm.

According to an embodiment, the method comprises an initial step of forming shallow insulating trenches which extend in the semiconductor layer, the first insulating layer, and the semiconductor substrate to delimit active areas.

According to an embodiment, the step of defining an opening is preceded by a step of forming a third insulating layer on the walls of the trench and the step of forming a single-crystal silicon region in the opening is followed by a step of removal of the third insulating layer.

According to an embodiment, the step of forming a second doped region at least in the remaining space of the trench is preceded by a step of forming spacers on the remaining walls of the trench.

According to an embodiment, the method further comprises a final step of defining openings of access to the first doped region and to the silicon layer.

According to an embodiment, the openings of access to the silicon layer and to the first doped region are obtained by performing a first etching of a portion of the second insulating layer and a second etching of the silicon layer and of the semiconductor layer.

According to an embodiment, the method further comprises a final step of annealing the structure.

According to an embodiment, the method further comprises a final step of silicidation of the device.

An embodiment further provides a bipolar transistor formed in a structure comprising a semiconductor layer extending on a semiconductor substrate with an interposed insulating layer, the transistor comprising a collector region defined at the surface of the semiconductor substrate, a buffer region between base and collector defined in an opening formed in the insulating layer opposite to the collector region, and base and emitter regions formed at the surface of the buffer region.

According to an embodiment, the semiconductor layer has a thickness ranging between 5 and 15 nm and the insulating layer has a thickness ranging between 10 and 50 nm.

According to an embodiment, the transistor further comprises a region of access to the base made of a single-crystal semiconductor material.

An embodiment further provides an integrated circuit comprising an association of at least one MOS transistor and of at least one bipolar transistor such as defined hereabove.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

For clarity, the same elements have been designated with the same reference numerals in the different drawings and, further, as usual in the representation of integrated circuits, the various drawings are not to scale.

DETAILED DESCRIPTION

A method for manufacturing a bipolar transistor on a FD-SOI-type substrate is here provided. FIGS. 2 to 18 illustrate results of steps of such a method.

Figure 1:
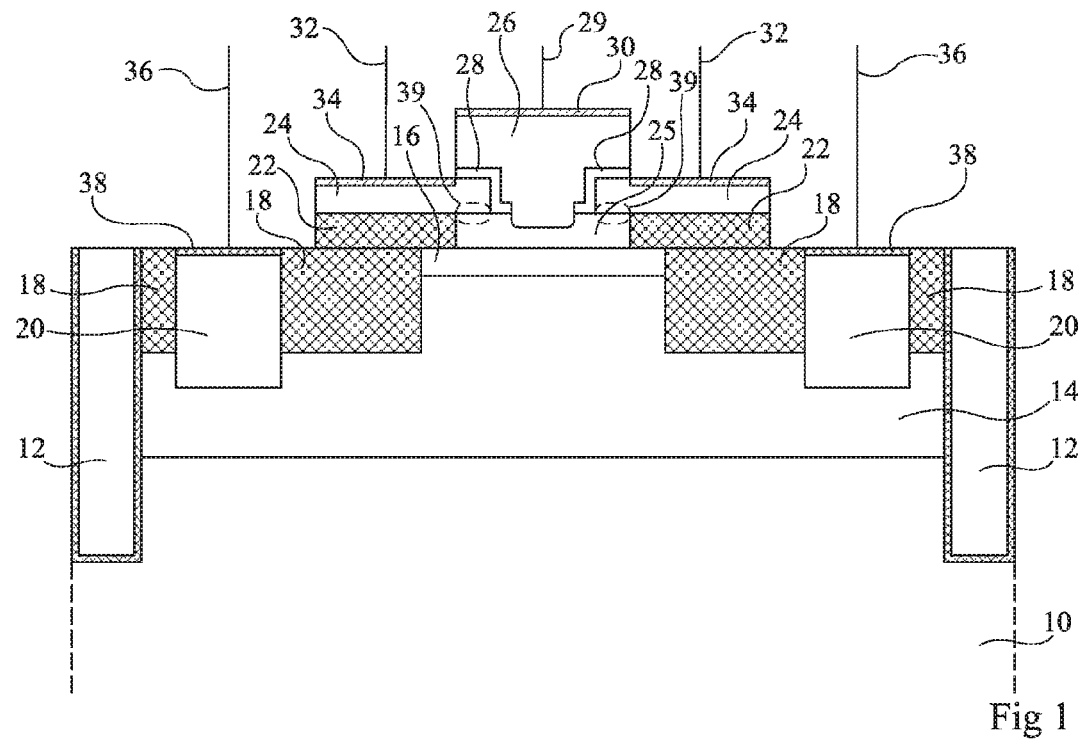
FIG. 1, previously described, illustrates a bipolar transistor formed on a solid substrate by a known method.
Figure 2:
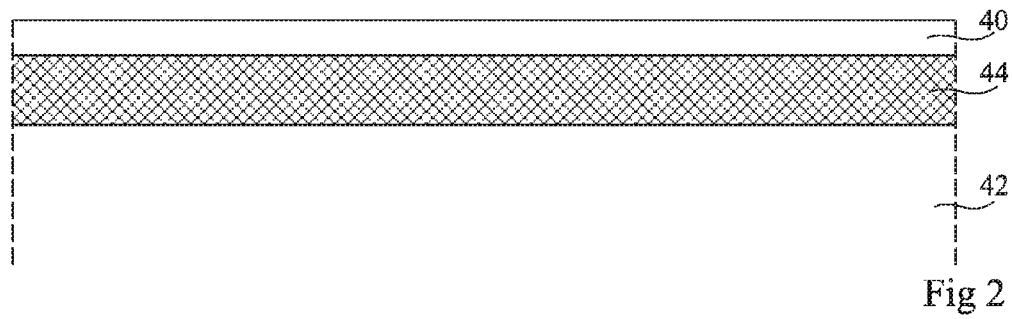
FIGS. 2 to 18 illustrate results of steps of a method for manufacturing a bipolar transistor according to an embodiment.

At a step illustrated in FIG. 2, it is started from a structure of FD-SOI type comprising an upper semiconductor layer 40 which extends on a semiconductor substrate 42 with an interposed insulating layer 44. Conventionally, such structures have an insulating layer 44 with a thickness ranging between 10 and 50 nm, for example, 25 nm, and a fully-depleted upper layer 40 with a thickness ranging between 5 and 15 nm, for example, 10 nm.

Figure 3:
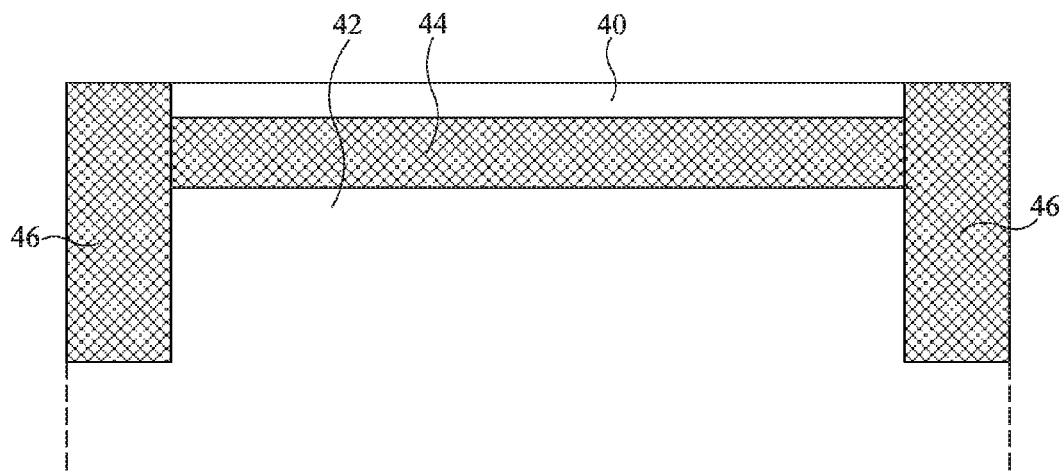

At a step illustrated in FIG. 3, shallow insulating trenches 46 (STI trenches) which cross semiconductor layer 40, insulating layer 44, and which penetrate in depth into semiconductor substrate 42 are formed. Trenches 46 extend down to a total depth ranging between 150 and 350 nm, for example, a depth equal to 250 nm.

Figure 4:
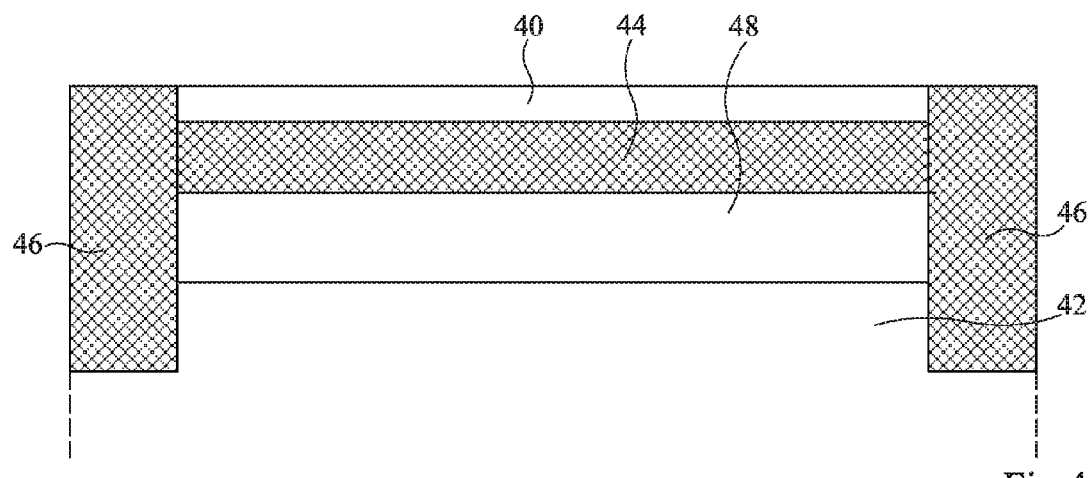

At a step illustrated in FIG. 4, a dopant implantation has been performed through semiconductor layer 40 and insulating layer 44, to form a heavily-doped region 48 at the surface of substrate 42 and in the active area laterally defined by insulating trenches 46. Region 48 may extend in substrate 42 across a thickness ranging between 100 and 300 nm and is doped at a dopant concentration ranging between $5.10^{18}$ and $5.10^{19}$ at/cm$^3$, for example, on the order of $10^{19}$ at/cm$^3$. Region 48 forms the collector region of the bipolar transistor. As an example, region 48 may be obtained by an arsenic implantation if the desired bipolar transistor is of type NPN.

Figure 5:
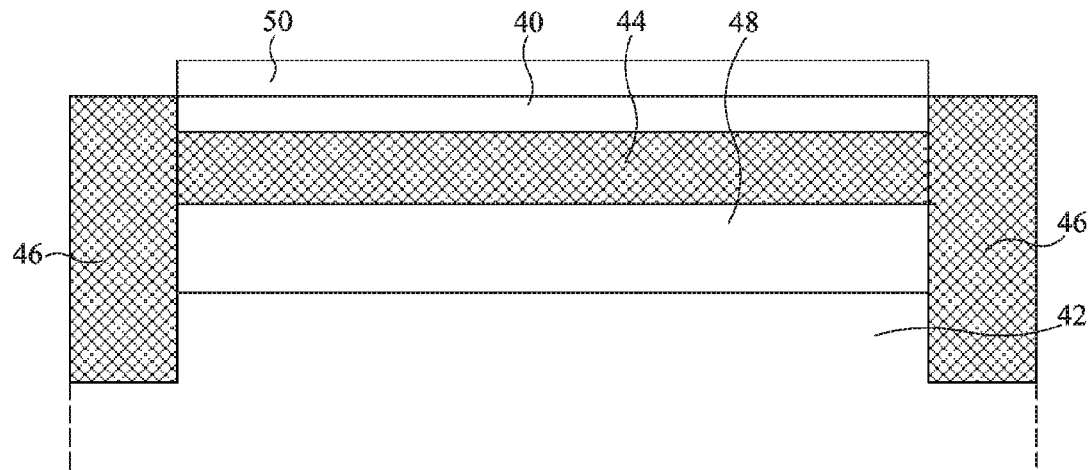

At a step illustrated in FIG. 5, a heavily-doped single-crystal silicon layer 50 of the conductivity type desired for the transistor base, for example, heavily doped with boron if an NPN bipolar transistor is desired, has been formed. Single-crystal silicon layer 50 is preferably formed by selective epitaxial growth (SEG), which enables the growth of a heavily-doped single-crystal silicon layer 50 only at the surface of layer 40, and not at the surface of insulating trenches 46. Silicon layer 50 has a thickness ranging between 20 and 60 nm, so that the stack of semiconductor layer 40 and of layer 50 has a total thickness ranging between 25 and 75 nm.

Figure 6:
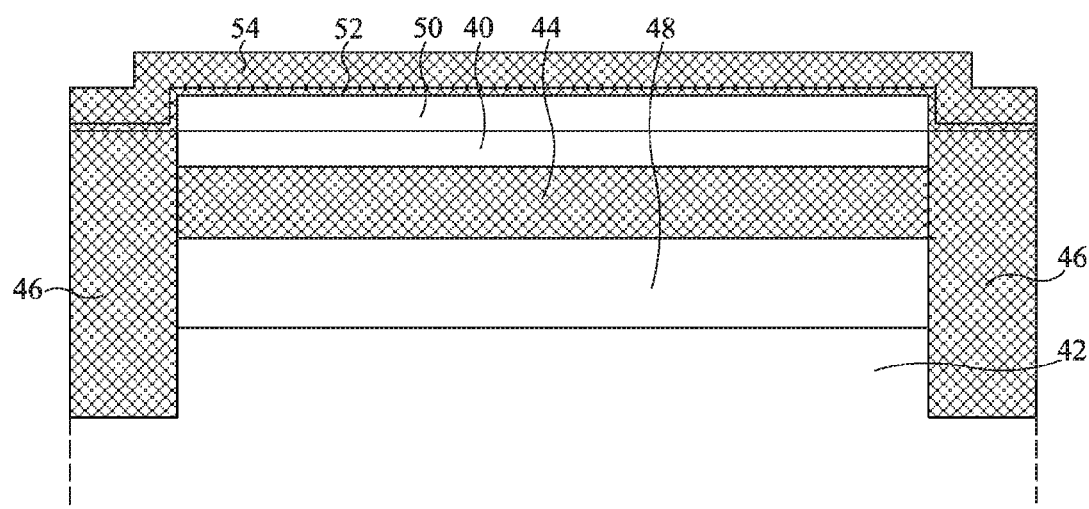

At a step illustrated in FIG. 6, a deposition, over the entire structure, of a first insulating layer 52 and of a second insulating layer 54 has been performed, second insulating layer 54 being made of a material different from that of insulating layer 52. As an example, first layer 52 may be made of a dielectric material such as tetraethoxysilane (TEOS) having a thickness ranging between 5 and 10 nm, for example, 8 nm, and layer 54 may be a silicon nitride layer having a thickness ranging between 30 and 80 nm, for example, equal to 50 nm. Layers 52 and 54 extend at the surface of heavily-doped single-crystal silicon layer 50, on the walls of this layer, and cover insulating trenches 46.

Figure 7:
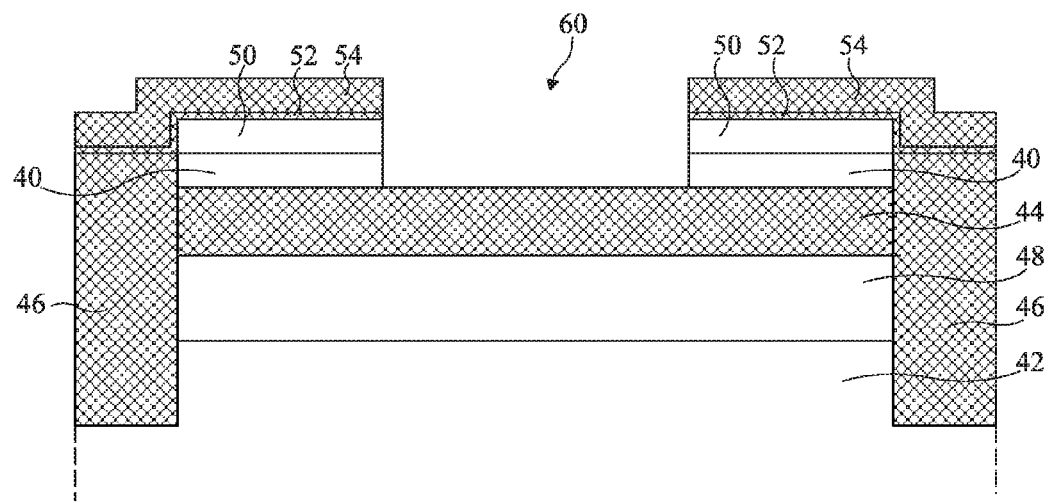

At a step illustrated in FIG. 7, a first trench 60, at the center of the active area, which crosses the stack of layers 54, 52, 50, and 40, has been defined to expose a portion of the upper surface of insulating layer 44. The etching enabling to define trench 60 may of course be, in practice, formed in several steps for etching the different materials of the above-mentioned layers.

Figure 8:
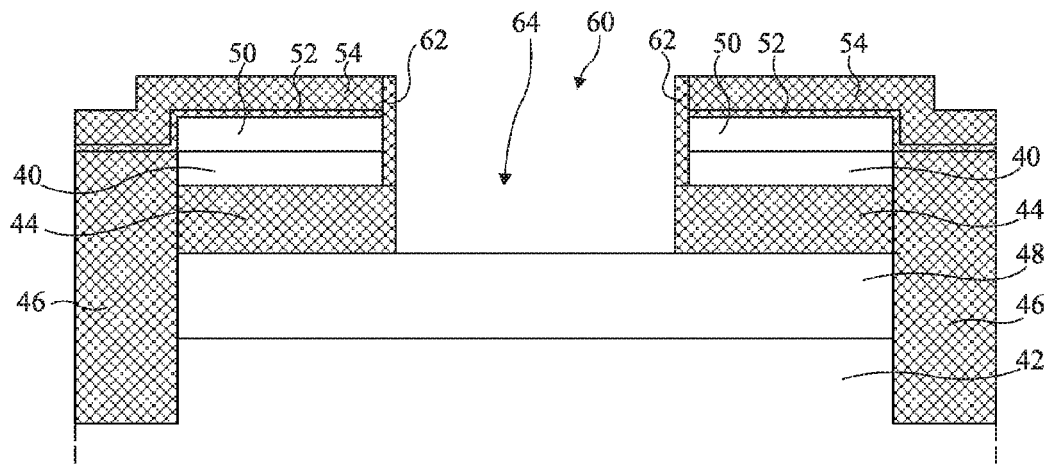

At a step illustrated in FIG. 8, on the walls of trench 60, an insulating material 62, for example, made of silicon nitride, has been formed. To form region 62 on the walls of trench 60, a nitride layer may be conformally deposited over the entire structure, after which an anisotropic etching is performed to remove the horizontal portions of the layer thus formed. Only regions 62 thus remain on the walls of trench 60. After, insulating layer 44 has been etched through the mask delimited by walls 62 to form a second trench 64 which extends through this layer to expose semiconductor substrate 42, at the level of heavily-doped region 48 formed at the surface of this substrate. The etching performed to remove layer 44 is selective over the nitride of walls 62 and/or of layer 54.

Figure 9:
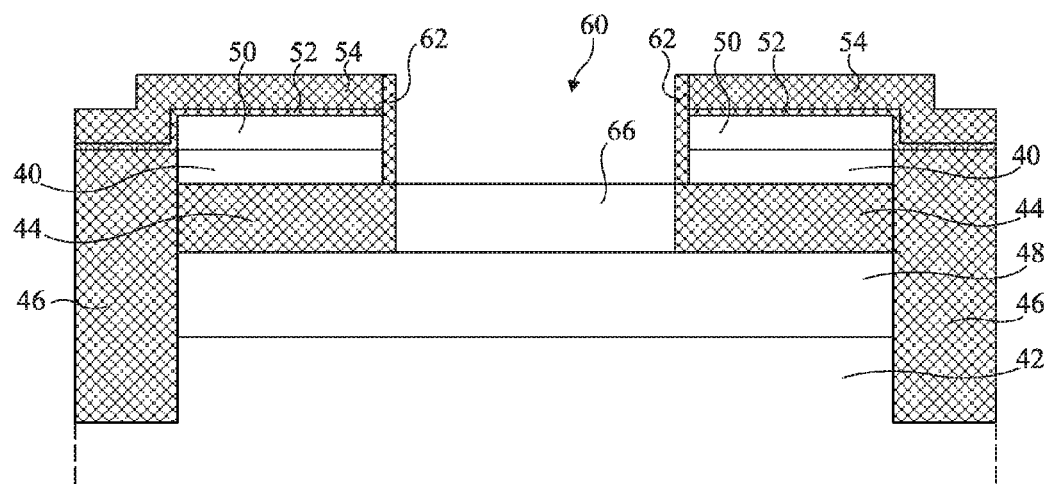

At a step illustrated in FIG. 9, a single-crystal silicon layer 66 has been grown from heavily-doped region 48. The growth of layer 66 is performed by low-temperature selective epitaxy, which provides a single-crystal silicon layer 66 having a well-controlled profile at the surface of region 48. The upper surface of layer 66 is provided to be flush with the surface of insulating layer 44. It should be noted that a slight misalignment between the surfaces of layers 66 and 44 is not critical, as long as this misalignment does not exceed some ten nanometers. Single-crystal silicon layer 66 forms a buffer area between base and collector.

Figure 10:
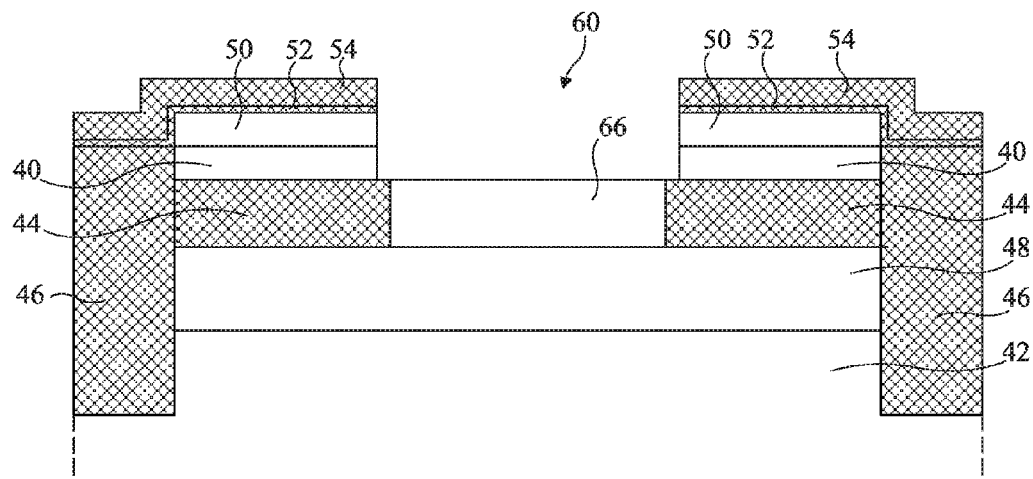

At a step illustrated in FIG. 10, insulating regions 62 have been etched. To achieve this, the silicon nitride has been selectively etched, this etching also eliminating an upper portion of nitride layer 54. As an example, the etching may be an isotropic plasma etching.

Figure 11:
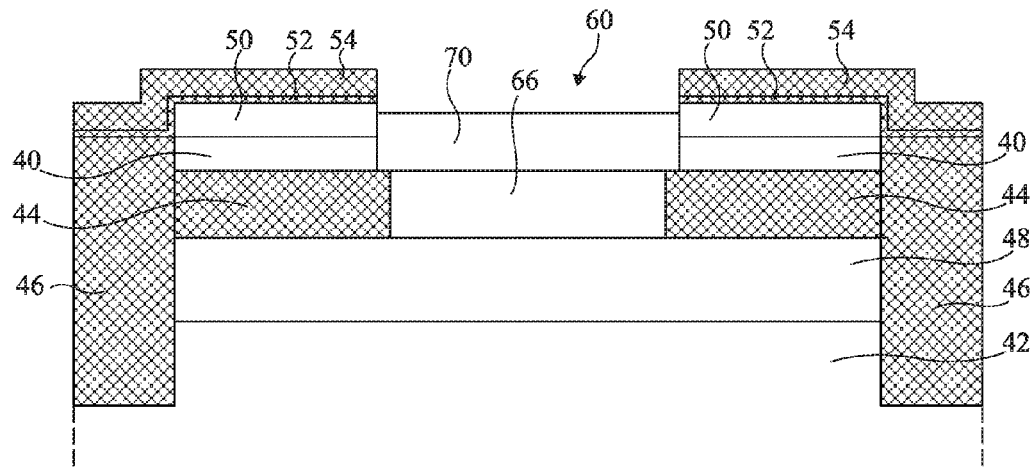

At a step illustrated in FIG. 11, on single-crystal silicon 66 and at the bottom of trench 60, a layer 70 has been grown. Layer 70 is formed of a stack of several layers, for example, a silicon-germanium layer and a silicon layer. The silicon-germanium layer contains the dopant of the base (boron if the transistor is an NPN transistor). The silicon-germanium layer may also contain carbon atoms to decrease the boron diffusion during subsequent anneals. The growth of layer 70 advantageously is a selective growth, easy to control, so that the upper surface of layer 70 extends under the upper surface of single-crystal silicon layer 50, or is flush with the upper surface of layer 50.

Figure 12:
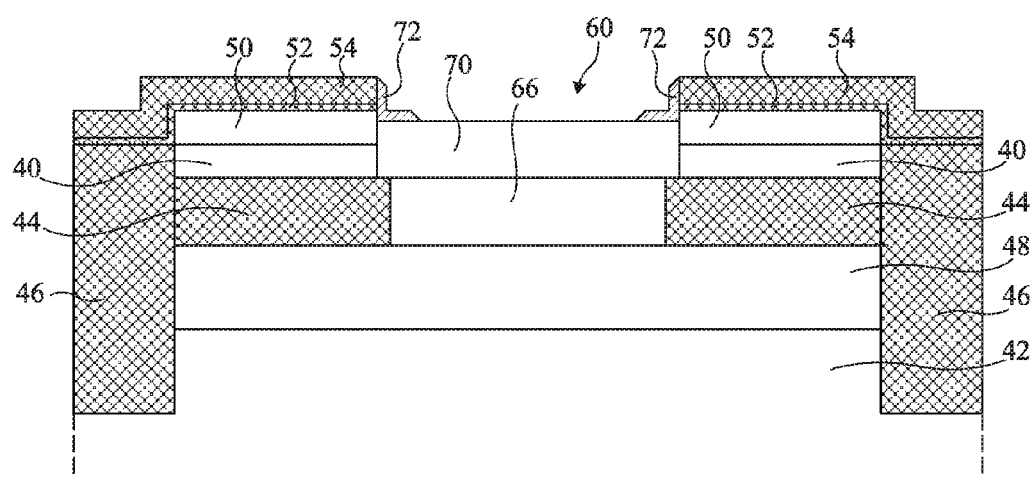

At a step illustrated in FIG. 12, conventional in the forming of vertical bipolar transistors, spacers 72 made of an insulating material, for example, an oxide, have been formed at the surface of layer 70. Spacers 72 extend on the contour of the upper surface of layer 70 and on the walls of trench 60. Thus, spacers 72 cover the edges of insulating regions 52 and 54, as well as the remaining edge, if present, of single-crystal silicon layer 50. Conventionally, spacers 72 may be formed by deposition of an oxide, followed by the deposition of amorphous silicon over the entire structure. An anisotropic etching of the amorphous silicon, followed by an etching of the material forming the spacers via the mask formed by the amorphous silicon, are then performed. The amorphous silicon may then be removed, which enables to obtain "L" shapes, characteristic of spacers, above layer 70. The amorphous silicon may also be kept above layer 70, this material mixing afterwards with the material deposited to form the transistor emitter.

Figure 13:
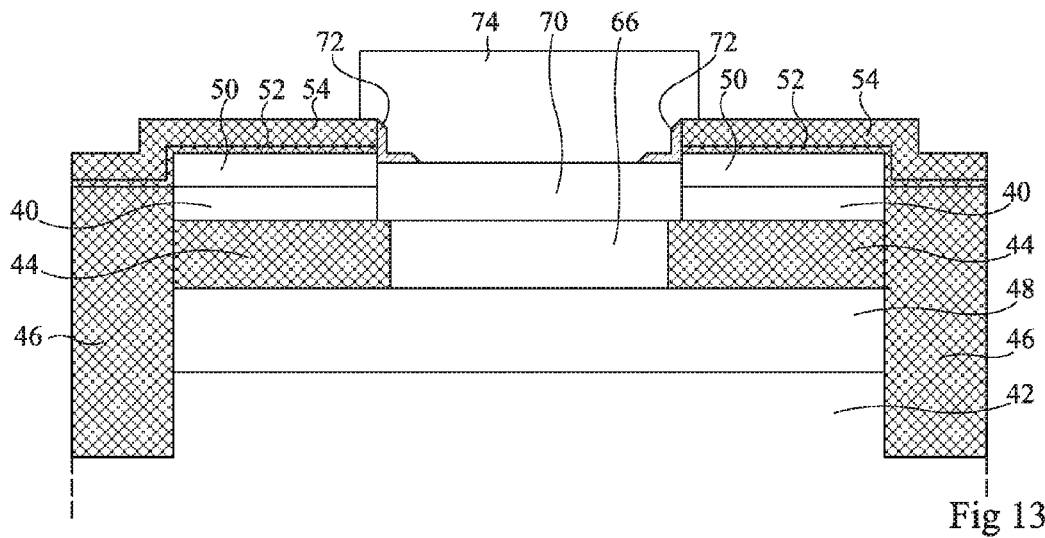

At a step illustrated in FIG. 13, a region of a heavily-doped material of a conductivity type capable of forming the emitter region of the bipolar transistor has been formed over the entire structure, to fill the space remaining in trench 60. Thus, if an NPN-type bipolar transistor is desired to be formed, this region may be heavily doped with arsenic atoms. An etching is then performed to only leave a heavily-doped emitter-forming portion 74 above layer 70, as well as above a portion of insulating material layer 54.

Figure 14:
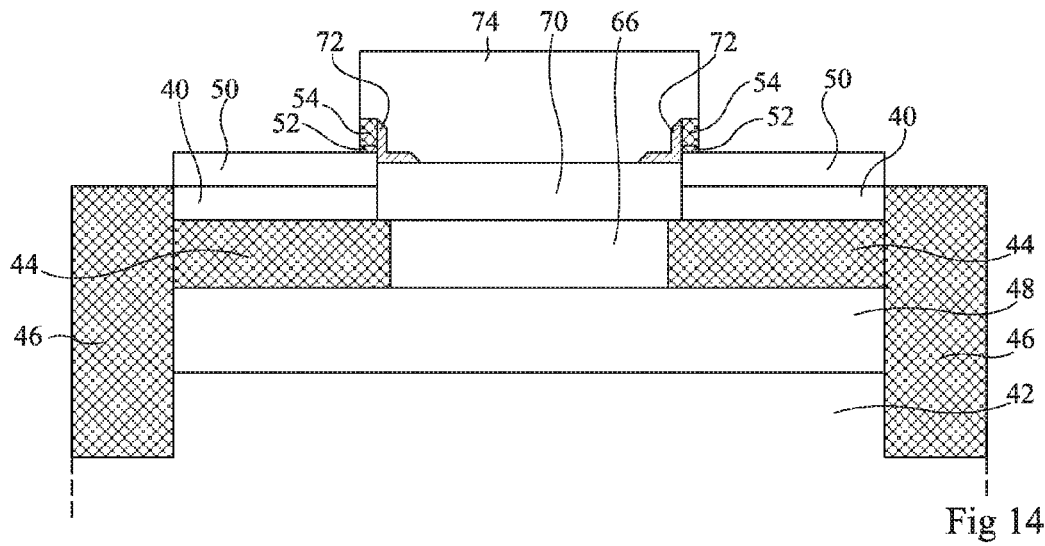

At a step illustrated in FIG. 14, via the mask formed of portion 74, insulating layers 54 and 52 have been etched. Thus, the surfaces of insulating trenches 46 are exposed, as well as the surface of heavily-doped single-crystal silicon layer 50. This etching may be of any known type capable of removing insulating layers 54 and 52.

Figure 15:
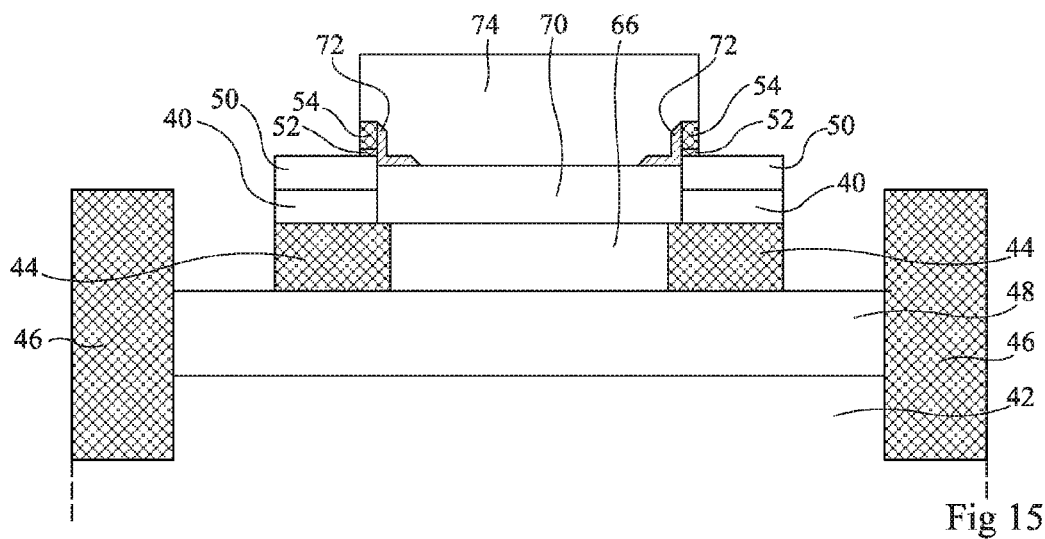

At a step illustrated in FIG. 15, a new etching has been performed, via a mask of adapted shape, to remove portions of layer 50, of layer 40, and of insulating layer 44 located on the contour of the device, that is, on the contour of the active area, for example in contact with insulating trenches 46. Thus, an access to heavily-doped region 48 forming the bipolar transistor collector is opened. This step may be carried out in several etch steps, a first step being capable of removing the semiconductor material of layers 50 and 40, and a second step being capable of removing the insulating material of layer 44.

Figure 16:
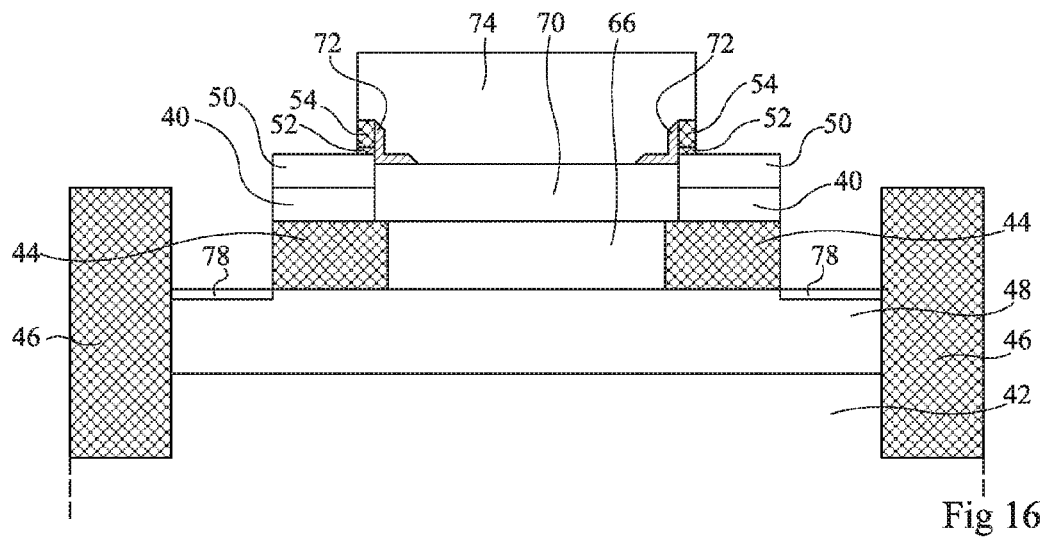

At a step illustrated in FIG. 16, via the same mask as that used to perform the etching of the step of FIG. 15, an implantation of dopants of the same conductivity type as that of region 48 has been performed at the surface of the exposed portions of region 48. Thus, at the surface of the exposed regions of region 48, heavily-doped regions 78 are formed, for example, at a dopant concentration ranging between $5.10^{19}$ and $5.10^{20}$ at/cm$^3$, for example, at $10^{20}$ at/cm$^3$.

Figure 17:
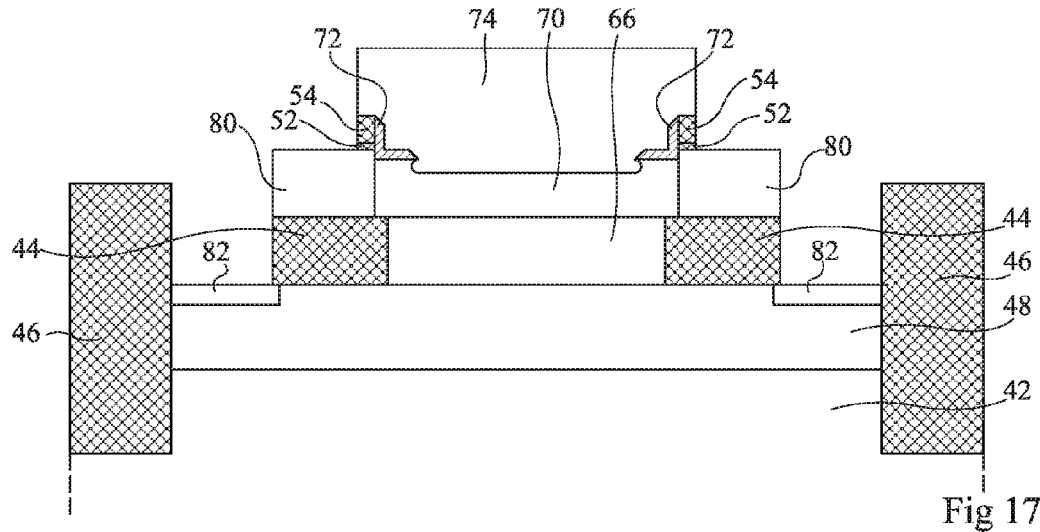

At the step illustrated in FIG. 17, the entire structure has been annealed. This anneal allows the diffusion of the doped regions of the different elements of the structure. In particular, this anneal enables to extend heavily-doped region 78 formed at the surface of layer 48, to form a more extended heavily-doped region 82 at the surface of this region. This anneal further enables for the dopant atoms of heavily-doped layer 50 to partly migrate to silicon layer 40 in order to form a single region 80. The obtained region 80 forms the region of access to the formed base of layer 70. The diffusion anneal further develops collector region 74 so that it extends slightly at the surface of layer 70. The anneal also implies a diffusion of dopant atoms from emitter 74 to the silicon layer comprised in the stack forming layer 70.

Figure 18:
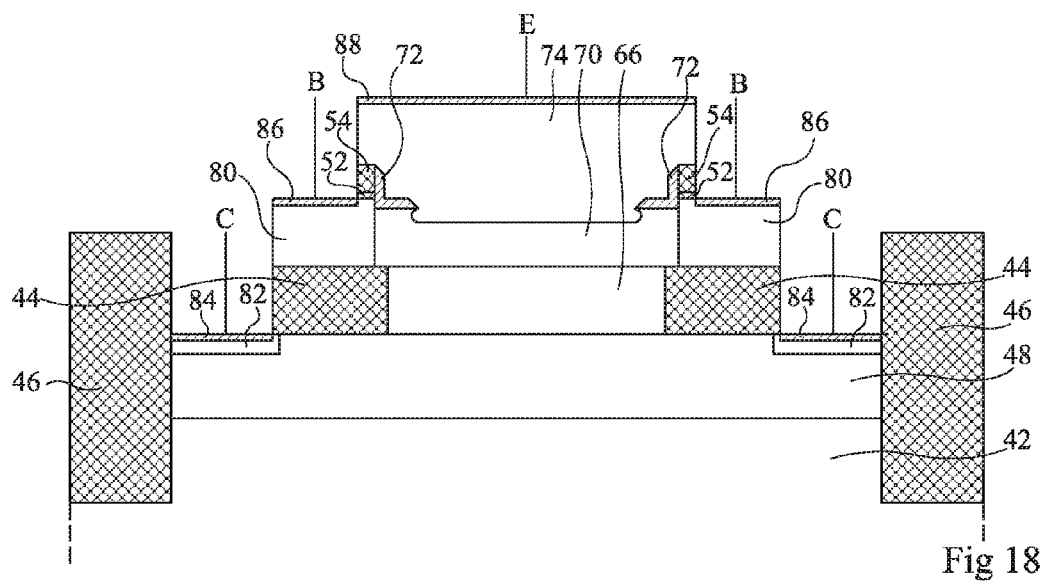
Figure 19:
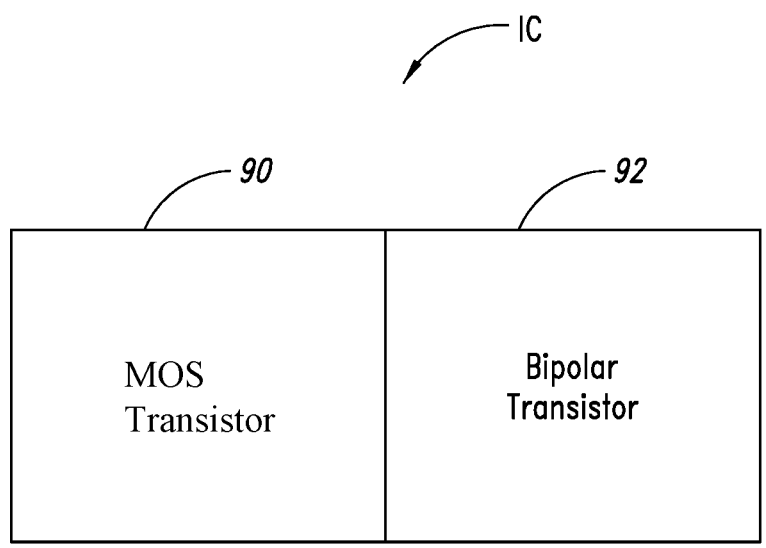
FIG. 19 is a schematic view of an integrated circuit that includes a MOS transistor and a bipolar transistor.

At a step illustrated in FIG. 18, a silicidation of the entire device, that is, a nickel deposition followed by a heat treatment and by adapted chemical treatments, has been performed without using a mask, which enables to transform the apparent silicon regions into conductive silicide regions. Thus, region 82 sees its surface covered with a silicide region 84, region 80 sees its surface covered with a silicide region 86, and region 74 sees its surface covered with a silicide region 88. Regions 84, 86, and 88 respectively form the contact regions of the collector, of the base, and of the emitter.

Thus, a bipolar transistor is obtained, having its structure extending in depth in the substrate of FD-SOI type, and thus avoiding having too large a thickness, at the surface of the device. The method provided herein is particularly compatible with the forming, in parallel, of MOS transistors on the FD-SOI substrate.

Further, the material of access to base 70 of semiconductor region 80 advantageously is heavily-doped single-crystal silicon. Thus, the resistance of access to the base is smaller than in the case of prior art where the access to the base was performed by means of a polysilicon region.

The method provided herein also enables to finely control the thicknesses of the emitter region, of the base region, of the buffer region between the collector and the base, and of the collector region, which provides a fine-quality vertical profile of the bipolar transistor, with characteristics that can easily be adjusted.

Further, the junction surface area between the base and the collector region is decreased, which enables to limit the base-collector junction capacitance with respect to prior art bipolar transistors.

Specific embodiments of the present disclosure have been described. Various alterations and modifications will occur to those skilled in the art. In particular, it should be noted that the conductivity types provided for the different regions of the bipolar transistor may be inverted to form, instead of an NPN transistor, a PNP transistor.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method for forming a bipolar transistor, the method comprising:
   forming a first doped region at a top surface of a semiconductor substrate;
   forming a first semiconductor layer over the top surface of the semiconductor substrate, wherein the first semiconductor layer includes a side surface that is substantially perpendicular to the top surface of the semiconductor substrate;
   forming a first insulating layer between the first doped region and the first semiconductor layer;
   forming a stack that includes a second semiconductor layer and a second insulating layer over the first semiconductor layer, wherein the second semiconductor layer includes a side surface that is substantially perpendicular to the top surface of the semiconductor substrate;
   forming an opening through said stack, said first semiconductor layer, and the first insulating layer above the first doped region;
   forming a single-crystal silicon region in said opening;
   forming a silicon-germanium region at a surface of the single-crystal silicon region and in contact with the side surfaces of the first semiconductor layer and of the second semiconductor layer; and
   forming a second doped region in the opening and over the single-crystal silicon region.

2. The method of claim 1, wherein the first semiconductor layer has a thickness ranging approximately between 5 nm and 15 nm and the first insulating layer has a thickness ranging approximately between 10 nm and 50 nm.

3. The method of claim 1, wherein prior to forming the first doped region, the method comprises forming shallow insulating trenches that extend into the first semiconductor layer, the first insulating layer, and the semiconductor substrate.

4. The method of claim 1, wherein forming the opening comprises etching a first opening having sidewalls through said stack and first semiconductor layer, and etching a second opening through the first insulating layer, and before etching the second opening, the method comprises forming a third insulating layer on the walls of the first opening, and after forming a single-crystal silicon region in the opening, the method comprises removing the third insulating layer.

5. The method of claim 1, wherein prior to forming a second doped region, the method comprises forming spacers on a portion of sidewalls of the opening.

6. The method of claim 1, further comprising forming openings to access the first doped region and the second semiconductor layer.

7. The method of claim 6, wherein forming openings to access the second semiconductor layer and the first doped region comprises in a first etch process, etching a portion of the second insulating layer, and in a second etch process, etching the second semiconductor layer and of the first semiconductor layer.

8. The method of claim 1, further comprising annealing the substrate and layers.

9. The method of claim 1, further comprising exposing the transistor to silicidation.

10. The method of claim 1, wherein forming the second doped region in the opening and over the single-crystal silicon region comprises filling remaining portions of the opening with the second doped region.

11. The method of claim 1, wherein prior to forming the stack, the method includes:
   forming the first doped region at a surface of the semiconductor substrate;
   forming the semiconductor layer over the surface of the semiconductor substrate; and
   forming the first insulating layer between the first doped region and the semiconductor layer.

12. A method, comprising:
   forming a bipolar transistor in a structure by steps including:
      forming a collector region defined in a semiconductor substrate having a first surface, the collector region extending to the first surface;
      forming a first insulating layer positioned on the semiconductor substrate, the first insulating layer having an opening;
      forming a single-crystal semiconductor base contact layer positioned on the first insulating layer, the first insulating layer being positioned between the base contact layer and the first surface of the semiconductor substrate, the base contact layer having an opening;
      forming a base region that is positioned in the opening in the base contact layer and is in lateral contact with the base contact layer;
      forming a buffer region of semiconductor material located in the opening in the first insulating layer and between the base region and the collector region; and
      forming an emitter region contacting a surface of said base region, the base region being positioned between the emitter region and the buffer region;
      forming a second insulating layer on the base contact layer;
      forming an opening through the second insulating layer;
      forming first spacers on sidewalls of the opening in the base contact layer and on a portion of the first insulating layer;
      forming the opening in the first insulating layer by extending the opening through the first insulating layer while using the first spacers as a mask; and
      widening the opening in the base contact layer by removing the first spacers, thereby making the opening in the base contact layer extend wider than the opening in the first insulating layer and on a portion of a top surface of the first insulating layer.

13. The method of claim 12, further comprising forming shallow insulating trenches that extend into the base contact layer, the first insulating layer, and the semiconductor substrate, prior to forming a second insulating layer on the base contact layer.

14. The method of claim 12, wherein:
   forming the base region includes forming a portion of the base region in contact with the portion of the top surface of the first insulating layer.

15. The method of claim 14, further comprising:
   forming second spacers in the opening in the base contact layer, lower portions of the second spacers contacting a top surface of the base region and upper portions of the second spacers contacting a side surface of the second insulating layer, wherein forming the emitter region includes forming the emitter region in the upper portion of the opening, between the spacers and on the base region.

16. The method of claim 12, further comprising:
   forming a second insulating layer on the base contact layer; and
   forming L-shaped spacers in the opening in the base contact layer, lower portions of the spacers contacting a top surface of the base region and upper portions of the spacers contacting a side surface of the second insulating layer, wherein forming the emitter region includes forming the emitter region between the spacers and on the base region.

17. The method of claim 12, further comprising:
   forming insulating trenches formed in the semiconductor substrate, the first insulating layer and the buffer region being positioned between the insulating trenches.

18. The method of claim 12, further comprising
   forming a MOS transistor associated by the bipolar transistor.

19. The method of claim 18, wherein the base contact layer has an opening and forming the base region includes positioning the base region in the opening in the base contact layer.

20. A method for forming a device, the method comprising:
   forming a first doped region at a surface of a semiconductor substrate;
   forming a semiconductor layer over the surface of the semiconductor substrate;
   forming a first insulating layer between the first doped region and the semiconductor layer;
   forming a stack that includes a silicon layer and a second insulating layer over the semiconductor layer;
   forming an opening through said stack, said semiconductor layer, and the first insulating layer above the first doped region;
   forming a single-crystal silicon region in said opening;
   forming a silicon-germanium region at a surface of the single-crystal silicon region and in contact with side surfaces of the semiconductor layer and of the silicon layer;
   forming a second doped region in the opening and over the single-crystal silicon region; and
   forming openings to access the first doped region and the silicon layer, wherein forming openings to access the silicon layer and the first doped region comprises in a first etch process, etching a portion of the second insulating layer, and in a second etch process, etching the silicon layer and of the semiconductor layer.

21. The method of claim 20, wherein prior to forming the first doped region, the method comprises forming shallow insulating trenches that extend into the semiconductor layer, the first insulating layer, and the semiconductor substrate.

22. The method of claim 20, further comprising annealing the semiconductor substrate and layers.

* * * * *